United States Patent [19]

Shimizu et al.

[11] Patent Number: 4,969,256
[45] Date of Patent: Nov. 13, 1990

[54] METHOD OF MOUNTING ELECTRONIC PARTS TO CIRCUIT BOARD

[75] Inventors: Takashi Shimizu, Kishiwada; Hiroshi Wada, Neyagawa, both of Japan

[73] Assignee: Matsushita Electric Industrial Co., Ltd., Kadoma, Japan

[21] Appl. No.: 478,721

[22] Filed: Feb. 8, 1990

Related U.S. Application Data

[63] Continuation of Ser. No. 275,900, Nov. 25, 1988, abandoned.

[51] Int. Cl.⁵ .................. H05K 13/04; H05K 3/30
[52] U.S. Cl. .............................. 29/834; 29/431; 29/593
[58] Field of Search .............. 29/430, 431, 593, 705, 29/740, 741, 759, 771, 783, 791, 794, 832, 834, 837, 840, 842, 846

[56] References Cited

U.S. PATENT DOCUMENTS

| | | | |
|---|---|---|---|
| 4,706,379 | 11/1987 | Seno et al. | 29/740 |
| 4,763,405 | 8/1988 | Morita et al. | 29/740 |
| 4,774,759 | 10/1988 | Makoto et al. | 29/741 |
| 4,794,689 | 1/1989 | Seno et al. | 29/740 |

FOREIGN PATENT DOCUMENTS 86299 5/1984 Japan ..................... 29/740

OTHER PUBLICATIONS

"Numerical Control, the Beginnings of Cam", pp. 133-151 of Cadicam Computer-Aided Design and Manufacturing, Groover et al., Prentice Hall Inc., N.J., 1984.

Primary Examiner—Timothy V. Eley
Assistant Examiner—Peter Dungba Vo
Attorney, Agent, or Firm—Wenderoth, Lind & Ponack

[57] ABSTRACT

A method of mounting parts, e.g. electronic parts, which includes the steps of supplying parts to a predetermined position by receiving the parts from part supply sections through a part transfer section of a circulation moving type having a plurality of part holding members, and mounting the parts by receiving the parts as supplied by the part transfer section at the predetermined position. The part holding members which are not used in the plurality of part holding members are classified so that the corresponding part holding members are controlled so as not to be used based on the classification. The consecutive steps of the electronic parts mounting method are illustrated in FIG. 1 of the drawings.

1 Claim, 9 Drawing Sheets

4,969,256

METHOD OF MOUNTING ELECTRONIC PARTS TO CIRCUIT BOARD

This application is a continuation of now abandoned application Ser. No. 07/275,900 filed on Nov. 25, 1988.

BACKGROUND OF THE INVENTION

The present invention generally relates to a part mounting process in the manufacture of electrical or electronic equipment, and more particularly, to a part mounting method for mounting electronic parts, etc. on a printed circuit board or the like.

Recently, as the automation of factory facilities proceeds, with a simultaneous requirement for higher productivity, the part mounting method as referred to above is required to be provided with higher performance and function for improved efficiency.

Referring to FIGS. 3 to 5, one example of conventional electronic part mounting methods will be described hereinafter.

In FIG. 3, there is shown an electronic part mounting machine provided with a part supplying mechanism of a circulation moving type, which generally includes a part holding member mounting ring 1, a plurality of part holding members 2 mounted on said mounting ring 1, a plurality of part supply cassettes 3 disposed around the mounting ring 1, and part inserting heads 4a and 4b (referred to as merely a head means hereinafter) for inserting the electronic parts on a circuit board (not shown). The part mounting machine further includes a main control panel 5 (referred to as a control panel hereinafter) having a keyboard, a control unit 6 for controlling the entire processing of the part mounting method, and an X-Y table 7 as shown.

In FIG. 4 showing a flow-chart for a conventional electronic part mounting method, step N1 is a supplying step in which the electronic part is supplied from the part supply cassette 3 to the part holding member 2 for displacement up to the position of the head means 4, while step N2 is a mounting step in which the electronic part is discharged from the part holding member 2 to the head means for mounting the part on a printed circuit board.

FIGS. 5(a) to 5(d) are schematic diagrams of the circulation moving type part supplying mechanism for explaining the conventional part mounting method, in which FIG. 5(a) represents the state before supplying the electronic part from the part supply cassette 3 to the part holding member 2, FIG. 5(b) denotes the state in which the electronic part A is supplied from the part supply cassette 3a to the part holding member 2a, FIG. 5(c) shows the state where the electronic part B is supplied from the part supply cassette 3b to the part holding member 2b, while simultaneously, the electronic part C is fed from the part supply cassette 3c to the part holding member 2c, and FIG. 5(d) indicates the state in which the part holding member 2a is displaced to the position of the head means 4.

With respect to the conventional part mounting method based on the arrangement as described above, the functioning thereof will be described hereinafter.

If attention is directed to one of the part holding members, after starting, the electronic part is fed to the part holding member 2 at the supplying process of step N1 in FIG. 4 and the part holding member 2 is then displaced up to the position of the head means 4, while at the mounting process of step N2, the electronic part is discharged onto the head means 4 from the part holding member 2 so as to be mounted on a printed circuit board. The empty part holding member 2 not holding any electronic part is subsequently moved up to the position of the part supply cassette 3 so as to be again supplied with another electronic part. In the steps of steps N1 and N2 in FIG. 4 as described above, the state of the part holding member is not particularly checked, and the electronic part is supplied or discharged unconditionally.

The conventional electronic part mounting method as referred to above will be explained hereinbelow for a more specific example with reference to a part supplying mechanism of a circulation moving type.

It is to be noted here that, for mounting the electronic parts on a printed circuit board in the order of the parts A, B and C, such parts must be arranged in the order of A, B and C at the position of the head means, and what effects such arrangement is the circulation moving type part supplying mechanism.

In the case where the part holding members 2a, 2b and 2c are set to receive the electronic parts A, B and C as in FIG. 5(a), the electronic part A is supplied when the part holding member 2a has arrived at the position of the part supply cassette 3a. Upon further rotation of the part holding member mounting ring 1 in a direction indicated by an arrow, when the part holding member 2b has reached the position of the part supply cassette 3b as shown in FIG. 5(c), the electronic part B is supplied. When the part holding member 2c has arrived at the position of the part supply cassette 3c simultaneously as in FIG. 5(c), the electronic part C is also supplied at this time. Then, the electronic parts are arranged in the order of A, B and C as shown in FIG. 5(d) so as to be fed to the head means 4 in that order, and the head means 4 mounts said parts onto a printed circuit board (not particularly shown).

In the conventional part mounting method as described so far, however, there have been such disadvantages that, if even one of the part holding members should become out of order, such a faulty part holding member drops the holding part, or even if it holds the part somehow, the part can not be correctly mounted at the mounting process, and thus, the mounting rate is undesirably lowered, with a simultaneous reduction in the working efficiency, since a processing machine had to be stopped until completion of replacement of the faulty part holding member.

SUMMARY OF THE INVENTION

Accordingly, an essential object of the present invention is to provide a method of mounting electronic parts or the like, which is so arranged that, even when some of the part holding members of a part mounting machine should become out of order, continuous operation of the part mounting machine is made possible without stopping thereof by using other normal part inserting members, with consequent improvements on working efficiency and mounting rate.

Another object of the present invention is to provide a method of mounting electronic parts or the like as described above, which is simple in steps, and readily incorporated into a manufacturing line of electronic equipment, etc.

In accomplishing these and other objects, according to one preferred embodiment of the present invention, there is provided a method of mounting parts which includes steps of supplying parts to a predetermined position by receiving the parts from part supply sections through a part transfer section of a circulation moving type having a plurality of part holding members, and mounting the parts by receiving the parts as supplied by the part transfer section at the predetermined position. The part holding members which are not used in the plurality of part holding members are to be classified by the method, whereby the corresponding part holding members are controlled so as not to be used based on the classification.

According to the method of mounting parts of the present invention as described above, even when one or more of the plurality of the part holding members should become faulty, continuous operation of the mounting machine is possible without stopping the machine by utilizing other normal part holding members, with a consequent improvement on the working efficiency, and furthermore, since it is not necessary to operate the machine by forcibly using the faulty part holding members, the part mounting rate has also been improved, while labor required for correcting erroneous mounting of parts can be advantageously eliminated.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE INVENTION

Figure 1:
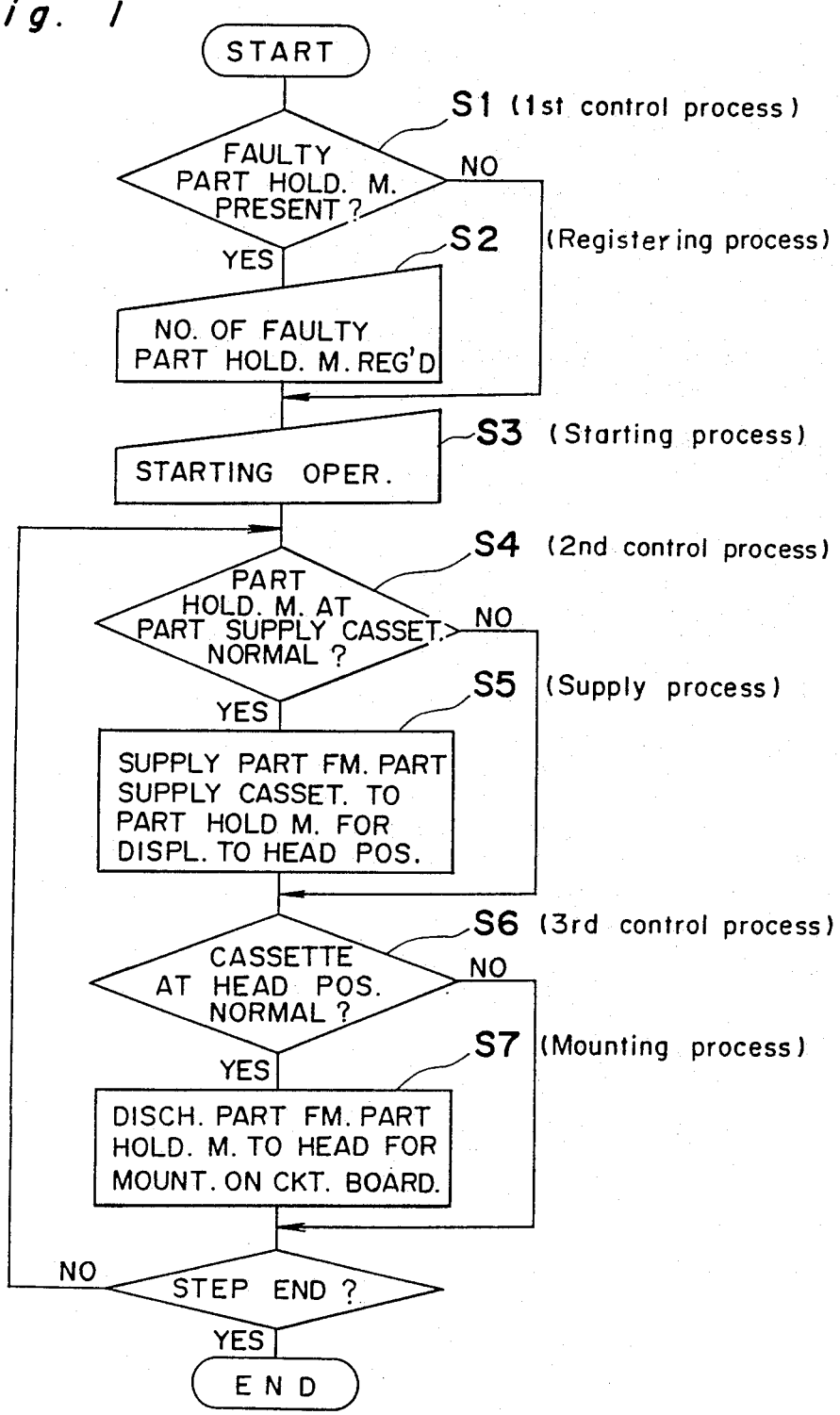
FIG. 1 is a flow-chart for explaining an electronic part mounting method according to one preferred embodiment of the present invention.

Before the description of the present invention proceeds, it is to be noted that like parts are designated by like reference numerals throughout the accompanying drawings.

Referring now to the drawings, FIG. 1 shows a flow-chart for explaining an electronic part mounting method according to one preferred embodiment of the present invention. FIGS. 2(a) to 2(g) are schematic diagrams for explaining functions of a circulation moving type part supplying mechanism according to the electronic part mounting method of the present invention, in which like parts in FIGS. 5(a) to 5(d) referred to earlier are designated by like reference numerals for brevity of explanation.

In FIG. 1, step S1 is a first control process, step S4 is a second control process, step S6 is a third control process, step S2 is a registering process, step S3 is a starting process, step S5 is a supply process, and step S7 is a mounting process.

In FIGS. 2(a) to 2(g), the supply mechanism includes the part holding member mounting ring 1, and a plurality of part holding members 2a, 2b, 2c, 2d and 2e mounted on the mounting ring 1, the part supply cassettes 3a, 3b, 3c and 3d disposed around said mounting ring 1 and respectively loaded with electronic parts A, B, C and D, and the part inserting head means 4, with all of the part holding members being successively numbered in such an order that the member 2a is 1, the member 2b is 2 and so forth.

Figure 2A:
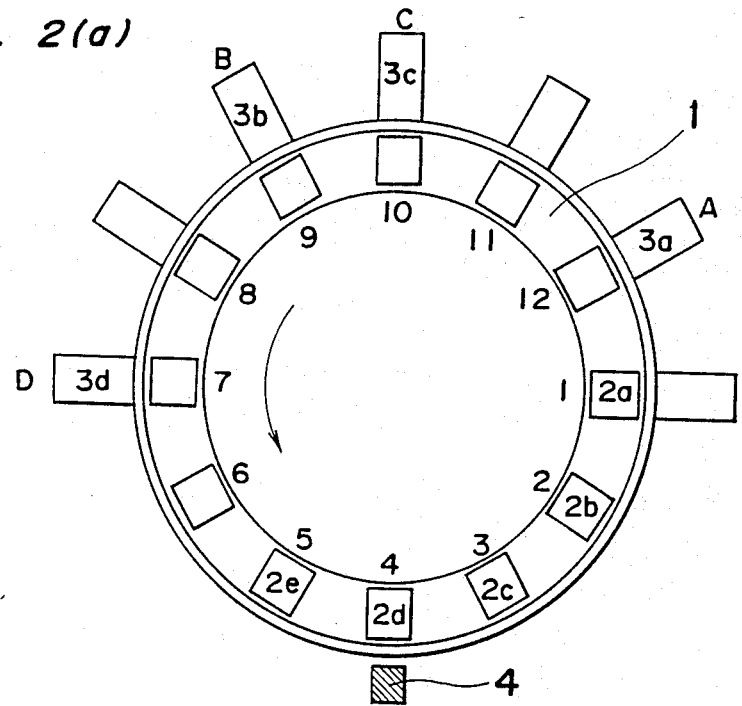
FIGS. 2(a) to 2(g) are schematic diagrams for explaining functions of a circulation moving type part supplying mechanism according to the electronic part mounting method of the present invention.
Figure 2B:
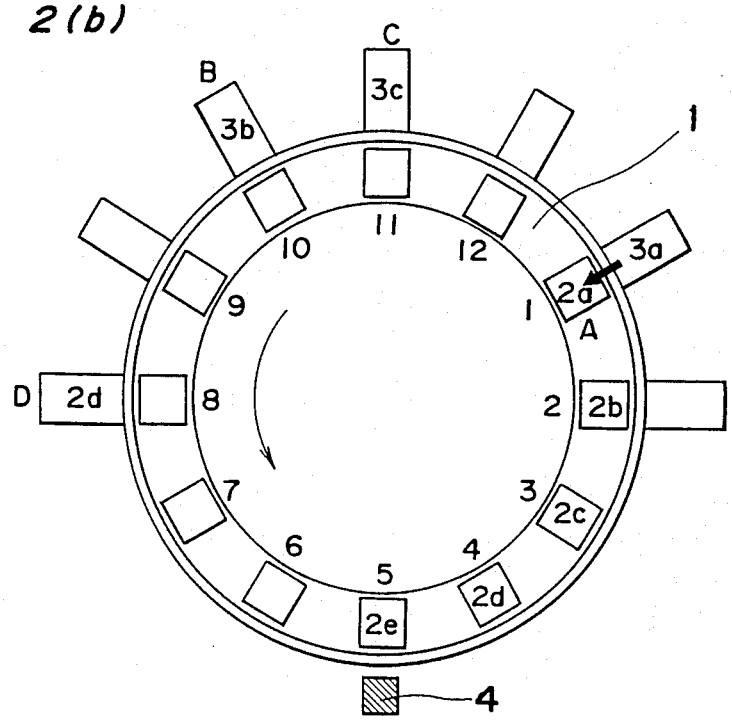
Figure 2C:
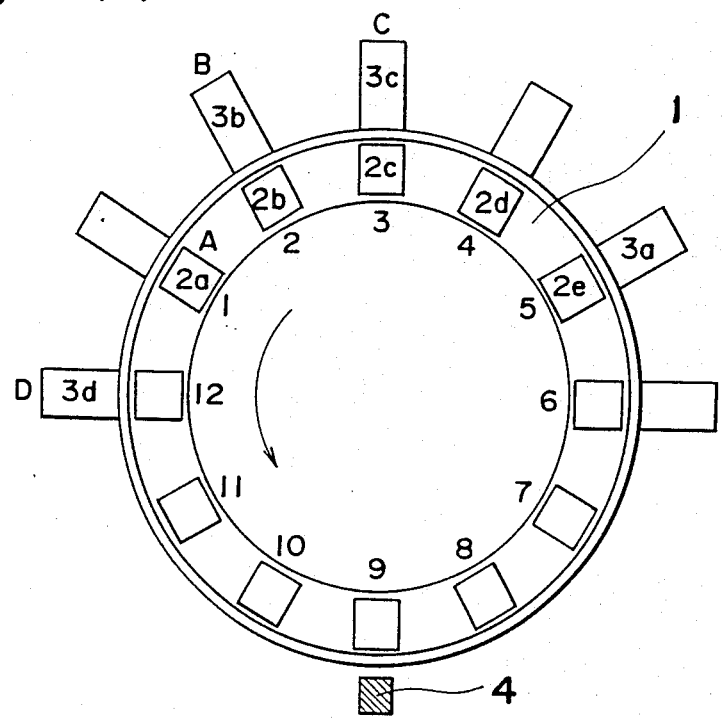
Figure 2D:
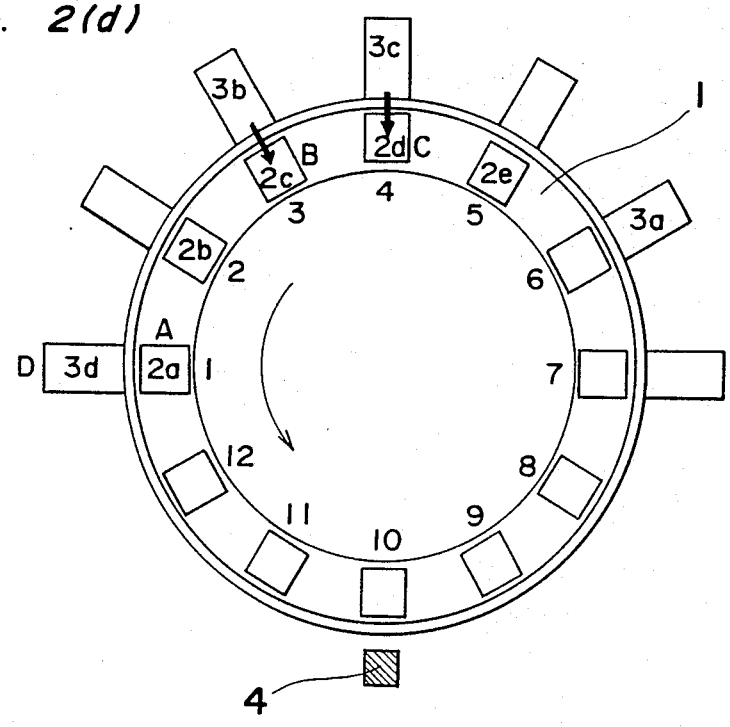
Figure 2E:
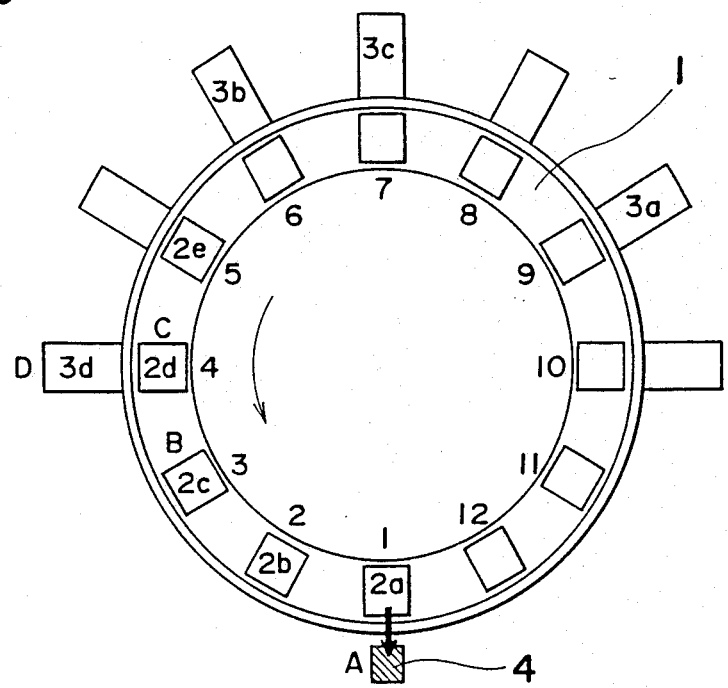
Figure 2F:
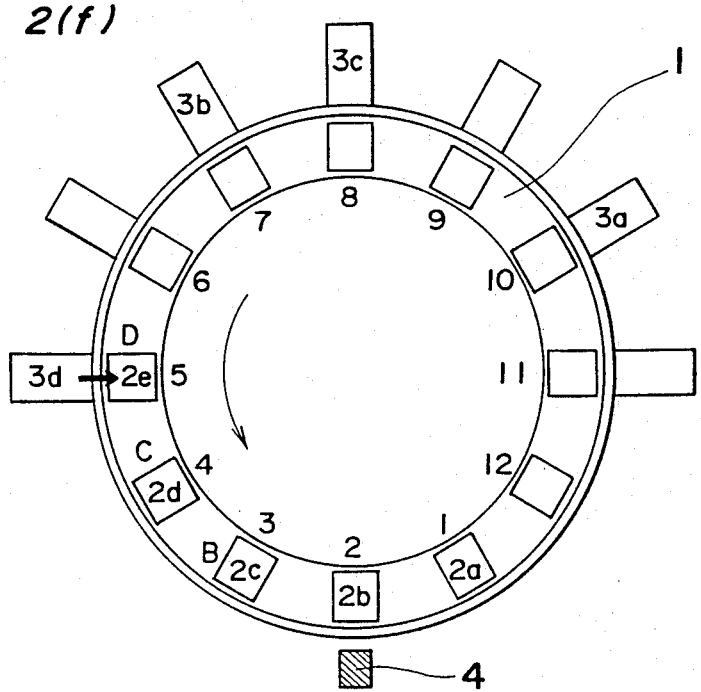
Figure 2G:
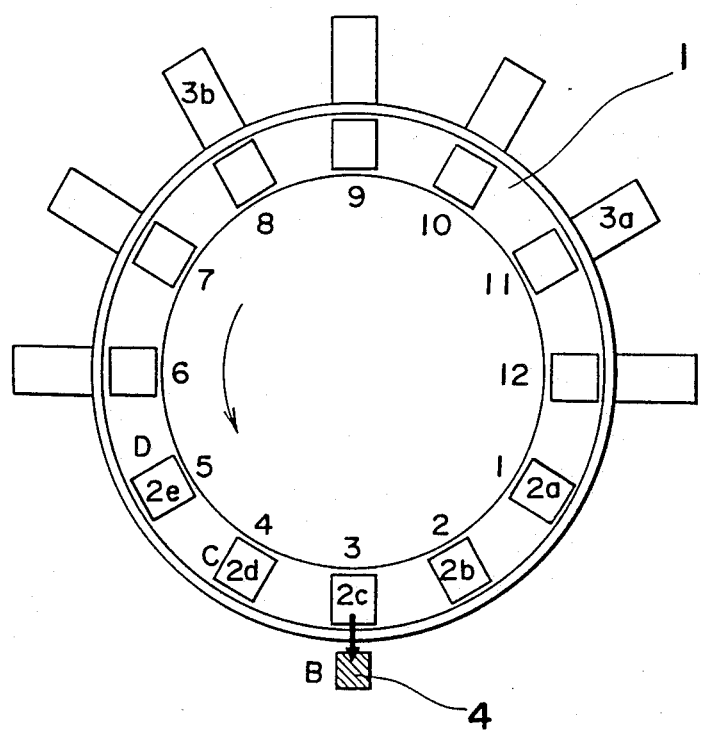

FIG. 2(a) represents the state before supplying the electronic part from the part supply cassette 3a to the part holding member 2a, FIG. 2(b) denotes the state in which the electronic part A is supplied from the part supply cassette 3a to the part holding member 2a, FIG. 2(c) shows the state where the electronic part is supplied neither to the part holding member 2b nor to 2c, FIG. 2(d) shows the state where the electronic part B is supplied from the part supply cassette 3b to the part holding member 2c, while simultaneously, the electronic part C is fed from the part supply cassette 3c to the part holding member 2d, FIG. 2(e) represents the state where the electronic part A is discharged from the part holding member 2a to the head means 4, FIG. 2(f) indicates the state where the electronic part is not discharged from the part holding member 2b to the head means 4, and FIG. 2(g) shows the state where the electronic part B is discharged from the part holding member 2c to the head means 4. Since the construction of the electronic part mounting machine in FIG. 3 has already been explained earlier, a description thereof has been abbreviated here for brevity.

Referring also to FIG. 1, functioning based on the electronic part mounting method according to the present invention will be described.

With attention directed to one of the part holding members, the functioning of the software is explained with reference to FIG. 1.

In the first place, at the first control process, a check is made as to whether or not there is any faulty part holding member (step S1), and if the answer is "YES", the number of the faulty part holding member is registered at the subsequent registering process (step S2), and the starting of mounting is instructed at the starting process (step S3). After starting, a check is first made at the second control process as to whether or not the part holding member positioned at the part supply cassette is normal (step S4), and if the answer is "YES", the supply process is effected (step S5). Subsequently, at the third control process, a check is made as to whether or not the part holding member located at the position of the head means is normal (step S6), and if the answer is "YES", the mounting process is effected (step S7).

Hereinbelow, a specific example of the functioning will be explained based on the schematic diagrams of FIGS. 2(a) to 2(g).

In the case where the electronic parts are to be mounted on a printed circuit board in the order of A, B, C and D, if the part holding member to be supplied with the electronic part A is set to be 2a as shown in FIG. 2(a), the remaining electronic parts B, C and D are to be respectively fed to the part holding members 2b, 2c and 2d. In this case, it is assumed that the part holding member 2b was faulty, and this was registered by the control panel 5 in FIG. 3, and that the part holding member mounting ring 1 was adapted to rotate in a counter-clockwise direction (i.e., leftward rotation).

As the part holding members are displaced, and when the part holding member 2a comes to the position of the part supply cassette 3a as shown in FIG. 2(b), the electronic part A is supplied thereto, since the holding member 2a is normal. Upon further displacement of the part holding members, when the holding member 2b reaches the position of the part supply cassette 3b as shown in FIG. 2(c), the electronic part B is not supplied thereto since the holding member 2b has been registered as faulty, but is fed to the subsequent normal part holding member 2c as shown in FIG. 2(d). In FIG. 2(c), although the part holding member 2c has reached the position of the part supply cassette 3c, since the electronic part B is to be supplied to the part holding member 2c from the part supply cassette 3b as shown in FIG. 2(d), the electronic part C is not supplied in the state of FIG. 2(c), and is fed to the normal part holding member 2d subsequent to the part holding member 2c as illustrated in FIG. 2(d). Similarly, the electronic part D is supplied not to the part holding member 2d, but to the next part holding member 2e. Thus, since the part holding member 2a is normal, upon arrival at the position of the head means 4, it discharges the electronic part A to the head means 4, but due to the fact that the next part holding member 2b is faulty as shown in FIG. 2(f), it holds no electronic part and therefore, does not discharge any electronic part to the head means 4. Accordingly, the head means 4 is temporarily stopped, and skips one time the function to mount the electronic part onto the printed circuit board. The X-Y table 7 is arranged to hold the printed circuit board for positioning thereof with respect to the head means 4 in synchronization with the functioning of said head means, and therefore, in the above case, is adapted to skip the positioning function one time, to correspond to the skipping of the function of the head 4 by one time. As described above, when the faulty part holding member is displaced to the position of the head means 4, the mounting process on the whole at step S7 is skipped one time as shown in FIG. 1. Meanwhile, the supply process at step S5 is effected, and the electronic part D is supplied to the part holding member 2e as shown in FIG. 2(f). Then, as shown in FIG. 2(g), the electronic part B is discharged from the part holding member 2c next to the part holding member 2b, to the head means 4.

Subsequently, registration of the faulty part holding member will be explained hereinafter.

Figure 3:
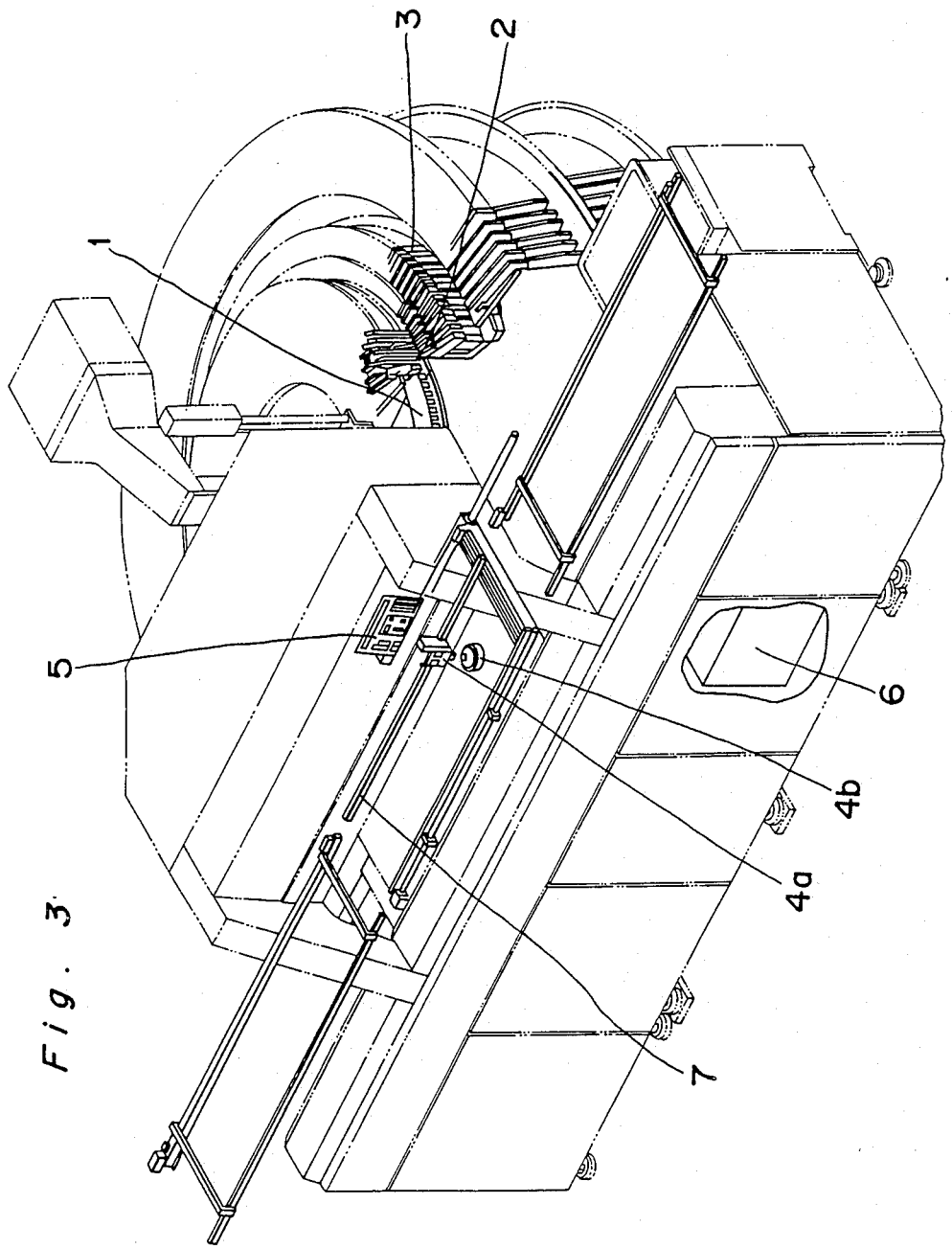
FIG. 3 is a perspective view of an electronic part mounting machine provided with the circulation moving type part supplying mechanism (already referred to)
Figure 4:
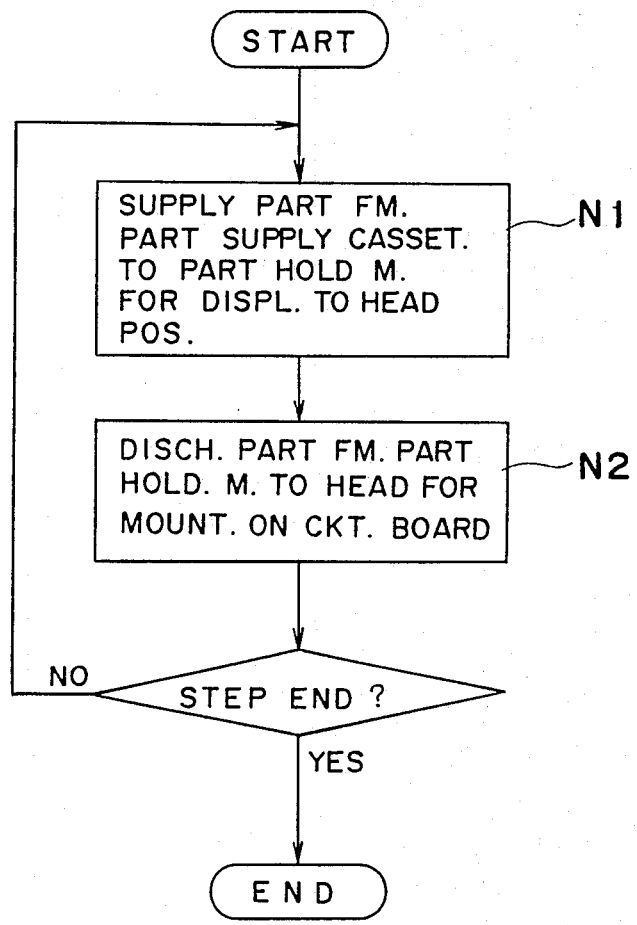
FIG. 4 is a flow-chart similar to FIG. 1, which is particularly intended to explain a conventional electronic part mounting method (already referred to)
Figure 5A:
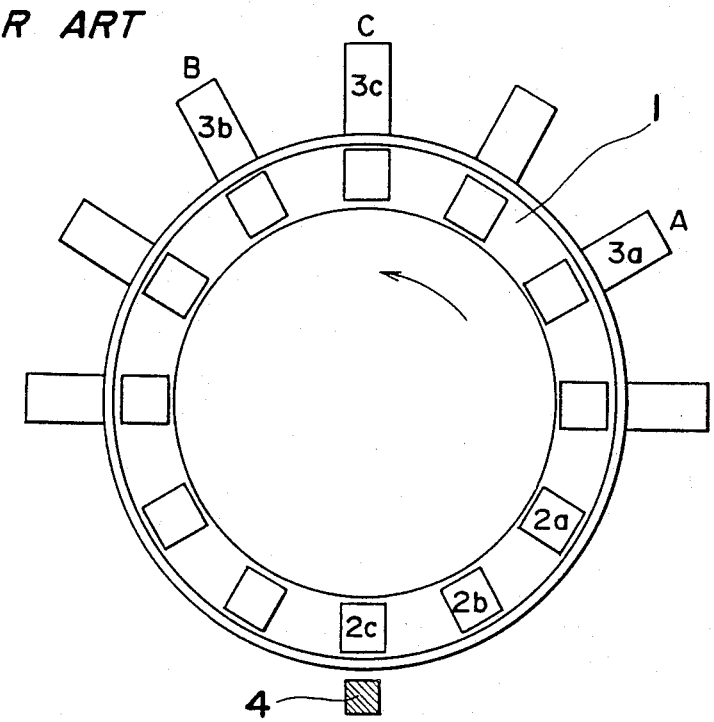
FIGS. 5(a) to 5(d) are schematic diagrams similar to FIGS. 2(a) to 2(g), which are particularly intended to explain functions of a part supplying mechanism for the conventional part mounting method (already referred to).
Figure 5B:
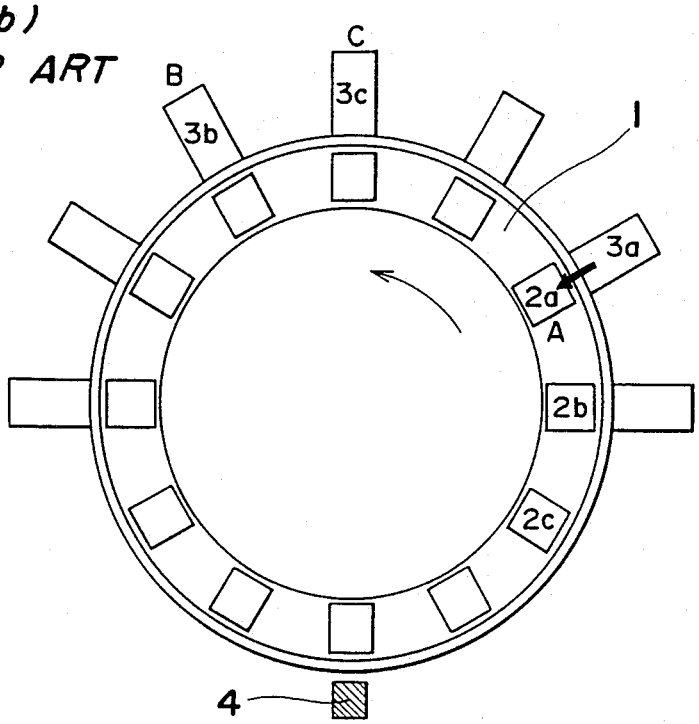
Figure 5C:
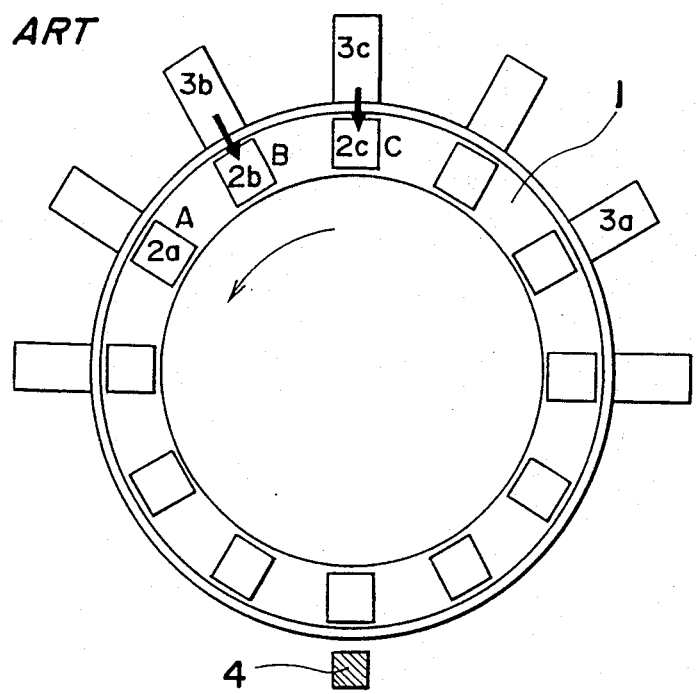
Figure 5D:
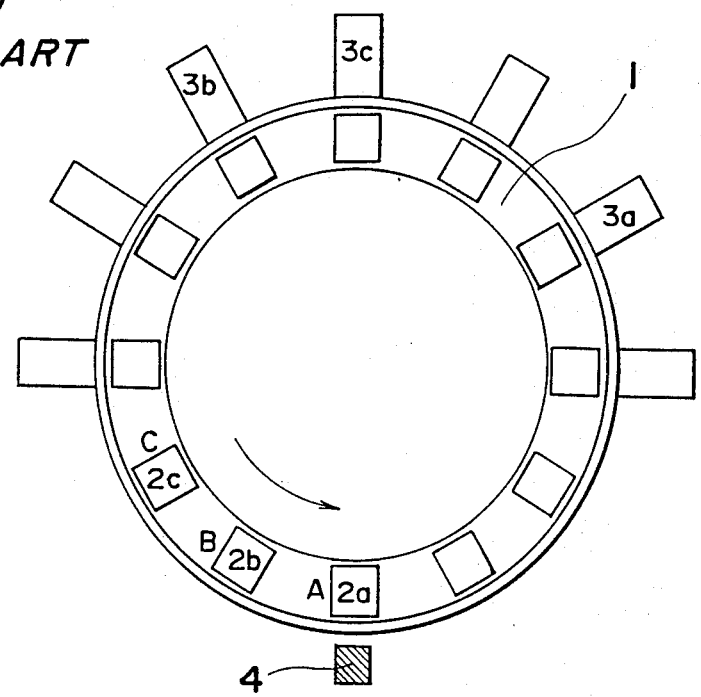

By way of example, there will be considered a case where, in FIG. 2(g), the part holding member 2c which has not been registered as faulty is also found faulty, and the electronic part B is not correctly mounted. The head means 4 is provided with a mechanism for detecting whether or not the mounting is correctly effected (referred to as mounting detection hereinafter), whereby when the mounting has not been correctly made as a result of the detection (referred to as mounting error hereinafter), the mounting machine is stopped at that time point in the case where automatic recovery is not effected. At this time, if the fault of the part holding member can be found, since the member 3 is affixed to the part holding member 2c, it may be registered by the control panel 5 as shown in FIG. 3 that the part holding member at the number 3 is faulty. Even when the fault of the part holding member could not be found at the above time point, since the control unit 6 in FIG. 3 has recorded the conditions for occurrence of the mounting error, it may be so judged that, if the mounting error takes place for the same electronic part, there is a possibility that the part supply cassette is faulty, while in the case where the mounting error occurs when the same part holding member is used, the part holding member is faulty. Owing to the arrangement that the part supply cassettes are also successively numbered, if the part supply cassette 3b in FIG. 2 is faulty, the electronic part B is reloaded onto the part supply cassette not used up to that time, and the part supply cassette number (part number) of the mounting data (NC data) may be altered by the control panel 5 in FIG. 3. With respect to the faults of the part holding member, there may be considered such cases that the part holding member itself is broken, that the part holding member is not correctly mounted on the part holding member mounting ring 1 shown in FIG. 3, or that the part holding member can not be mounted on the mounting ring 1 due to breakage, etc. In such a case, when the defective part holding member has been correctly replaced by a perfect part holding member, the replaced one becomes usable by registering again that it is non-defective by the control panel 5.

As is clear from the foregoing description, through employment of the part mounting method of the present invention in which the part holding members which are not used in the plurality of part holding members are classified, whereby the corresponding part holding members are controlled so as not to be used based on the classification, as compared with the conventional electronic part mounting method, continuous operation of the mounting machine becomes possible without stopping the machine by utilizing other normal part holding members, with a consequent improvement on the working efficiency, and furthermore, since it is not necessary to operate the machine by forcibly using the faulty part holding members, the part mounting rate has also been improved, while labor required for correcting erroneous mounting of parts can be advantageously eliminated.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of mounting parts by supplying said parts to a predetermined position and by receiving said parts from part supply sections of a part supply cassette via a part transfer section, said part transfer section having a plurality of part holding members each having an identification designation and thereby mounting the parts by receiving said parts as supplied by said part transfer section at said predetermined position, the method comprising the following consecutive steps:

determining whether each of the plurality of part holding member is normal or faulty in a first control step;

registering the identification designation of those of the plurality of part holding members which have been found to be faulty in the first control step;

starting the mounting of said parts in a starting step;

determining if the part holding member which is positioned at the part supply cassette is normal or faulty in a second control step;

supplying said part from the part supply cassette to the part holding member thereby displacing said part to a head position only if the part holding member has been found to be normal in the second control step;

determining if the part holding member disposed at the head position is normal or faulty in a third control step;

discharging the part from the part holding member to a head thereby effectively mounting said part to said head only if the part holding member has been found to be normal in the third control step.

* * * * *